United States Patent
Wu et al.

(10) Patent No.: US 7,923,718 B2
(45) Date of Patent: Apr. 12, 2011

(54) ORGANIC THIN FILM TRANSISTOR WITH DUAL LAYER ELECTRODES

(75) Inventors: Yiliang Wu, Mississauga (CA); Beng S. Ong, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 78 days.

(21) Appl. No.: 11/564,438

(22) Filed: Nov. 29, 2006

(65) Prior Publication Data

US 2008/0121869 A1    May 29, 2008

(51) Int. Cl.
*H01L 29/08* (2006.01)
(52) U.S. Cl. .......................................................... 257/40
(58) Field of Classification Search ............... 257/40, 257/E51.029, E51.006
See application file for complete search history.

(56) References Cited

U.S. PATENT DOCUMENTS

| | | | | |
|---|---|---|---|---|
| 6,448,578 B1 * | 9/2002 | Shimada et al. | ............... | 257/59 |
| 6,770,904 B2 | 8/2004 | Ong et al. | | |
| 6,910,933 B1 * | 6/2005 | Matsuo et al. | ............... | 445/24 |
| 6,953,947 B2 * | 10/2005 | Son et al. | ............... | 257/40 |
| 7,355,199 B2 * | 4/2008 | Meng | ............... | 257/40 |
| 2002/0153566 A1 * | 10/2002 | Hwang | ............... | 257/347 |
| 2003/0020059 A1 * | 1/2003 | Komoda et al. | ............... | 257/10 |
| 2004/0012017 A1 * | 1/2004 | Nagayama | ............... | 257/40 |
| 2004/0012071 A1 * | 1/2004 | Ido et al. | ............... | 257/529 |
| 2004/0108562 A1 | 6/2004 | Nagayama et al. | | |
| 2004/0164294 A1 | 8/2004 | Son et al. | | |
| 2004/0238814 A1 * | 12/2004 | Mizusaki et al. | ............... | 257/40 |
| 2005/0017311 A1 * | 1/2005 | Ong et al. | ............... | 257/400 |
| 2006/0054883 A1 | 3/2006 | Hanna et al. | | |
| 2006/0108581 A1 * | 5/2006 | Ahn et al. | ............... | 257/40 |
| 2006/0155105 A1 * | 7/2006 | Werner et al. | ............... | 528/377 |
| 2006/0267006 A1 * | 11/2006 | Ando et al. | ............... | 257/40 |
| 2006/0273303 A1 | 12/2006 | Wu et al. | | |
| 2008/0135836 A1 * | 6/2008 | Gelinck et al. | ............... | 257/40 |

OTHER PUBLICATIONS

Wu, et al., U.S. Appl. No. 11/146,705, filed Jun. 7, 2005 for "Organic Thin Film Transistors With Multilayer Electrodes".
European Search Report, Mar. 6, 2009.

* cited by examiner

*Primary Examiner* — Tom Thomas
*Assistant Examiner* — Hajar Kolahdouzan
(74) *Attorney, Agent, or Firm* — Fay Sharpe LLP

(57) ABSTRACT

A thin-film transistor (TFT) with dual-layer source and drain electrodes is provided. Each source and drain electrode comprises a first layer and a second layer. The first layer has a work function which differs from the energy level of the semiconductor by at least 0.5 eV and the second layer has a work function matching the energy level of the semiconductor. The semiconductor has a short channel length.

16 Claims, 2 Drawing Sheets

ORGANIC THIN FILM TRANSISTOR WITH DUAL LAYER ELECTRODES

BACKGROUND

The present disclosure relates, in various embodiments, to multilayer electrodes and thin-film transistors (TFTs) comprising the same.

TFTs are fundamental components in modern-age electronics, including, for example, sensor, imaging, and display devices. TFT circuits using current mainstream silicon technology may be too costly for some applications, particularly for large-area electronic devices such as backplane switching circuits for displays (e.g., active matrix liquid crystal monitors or televisions) and low-end electronic devices such as radio frequency identification (RFID) tags where high switching speeds and/or high density are not essential. The high costs of silicon-based TFT circuits are primarily due to the capital-intensive silicon fabrications as well as the complex high-temperature, high-vacuum photolithographic fabrication processes under strictly controlled environments needed to make them. Because of the cost and complexity of fabricating silicon-based TFT circuits using conventional photolithography processes, there has been an increased interest in organic TFTs (OTFTs). Organic materials offer not only the possibility of using low-cost solution or liquid fabrication techniques, but also attractive mechanical properties such as being physically compact, lightweight, and flexible.

OTFTs are generally composed of, on a substrate, an electrically conductive gate electrode, source and drain electrodes, an electrically insulating gate dielectric layer which separate the gate electrode from the source and drain electrodes, and a semiconducting layer which is in contact with the gate dielectric layer and bridges the source and drain electrodes. Their performance can be determined by the field effect mobility and the current on/off ratio. High mobility and high on/off ratio are desired.

Both the mobility and on/off ratio are affected by the total resistance between the source and drain electrodes, $R_{total}$. If the total resistance is high, then high electrical field strengths are necessary to inject and extract charge carriers. The total resistance can be determined using the formula:

$$R_{total} = R_{contact} + R_{sc}$$

$R_{contact}$ is the contact resistance at the interface of each electrode and the semiconductor layer. $R_{sc}$ is the resistance in the length of the semiconductor layer between the source and drain electrodes.

One way to lower the total resistance is to lower $R_{sc}$ by reducing the semiconductor channel length between the source and drain electrodes. This increases mobility, but reduces the on/off ratio if the $R_{contact}$ is very low. This limits the application of such a TFT.

Another way to lower the total resistance is to reduce the contact resistance. Contact resistance is generally minimized by selecting an electrode material having a work function identical or very close to energy level of the semiconductor. The energy level is the highest occupied molecular orbital (HOMO) of the semiconductor in the case of p-type semiconductor or the lowest unoccupied molecular orbital (LUMO) of the semiconductor in the case of n-type semiconductor. If contact resistance is minimized when $R_{sc}$ is low, however, the current on/off ratio decreases because the TFT exhibits high off current.

BRIEF DESCRIPTION

The present disclosure relates, through various exemplary embodiments, to TFTs. The TFT comprises a substrate, a gate electrode, a source electrode, a drain electrode, a gate dielectric layer and a semiconductor layer. The source and drain electrodes comprise first and second layers wherein both the first and second layers are in direct contact with the semiconductor layer.

In further embodiments of the present disclosure, the TFTs are organic TFTs, wherein the semiconductor layer is an organic semiconductor layer.

The source and drain electrodes each comprise first and second layers. Each first layer comprises a material having a work function differing from the energy level of the semiconductor layer by at least 0.5 eV. Each second layer comprises a material having a work function identical to or differing from the energy level of the semiconductor layer by at most 0.2 eV. This design, where contact resistance is intentionally introduced, results in a TFT having both high mobility and high current on/off ratio.

In other embodiments, the source electrode first layer and the drain electrode first layer each have a thickness of at most 50 nanometers. In further embodiments, the source electrode first layer and the drain electrode first layer each have a thickness of from about 5 nanometers to about 50 nanometers.

In additional embodiments, the source electrode second layer and the drain electrode second layer each have a thickness of at least 5 nanometers. In further embodiments, the source electrode second layer and the drain electrode second layer each have a thickness of from about 20 to about 1000 nanometers.

In still further embodiments, the difference between the energy level of the semiconductor layer and the work function of the source electrode first layer is from about 0.5 eV to about 1.0 eV. In other embodiments, the difference is at least 1.0 eV.

In still other embodiments, the semiconductor is a p-type semiconductor and the energy level of the semiconductor is based on the HOMO of the semiconductor.

In still additional embodiments, the semiconductor channel length is at most 20 micrometers. In further embodiments, the semiconductor channel length is at most 10 micrometers. In other embodiments, the semiconductor channel length is from about 5 to about 10 micrometers. In still further embodiments, the semiconductor channel length is from about 1 to about 5 micrometers.

In other embodiments, the source electrode first layer, the drain electrode first layer, the source electrode second layer, and the drain electrode second layer each directly contact the semiconductor layer.

In further embodiments, the source electrode second layer has a work function matching the energy level of the semiconductor layer.

In additional embodiments, each first layer comprises titanium. In further embodiments, each second layer comprises gold.

In still further embodiments, the transistor is a bottom-gate bottom-contact transistor.

In further embodiments, the transistor has improved performance with enhanced mobility and on/off current ratio.

These and other non-limiting characteristics of the disclosure are more particularly disclosed below.

BRIEF DESCRIPTION OF THE DRAWINGS

The following is a brief description of the drawings, which are presented for the purposes of illustrating the exemplary embodiments disclosed herein and not for the purposes of limiting the same.

DETAILED DESCRIPTION

Figure 1:
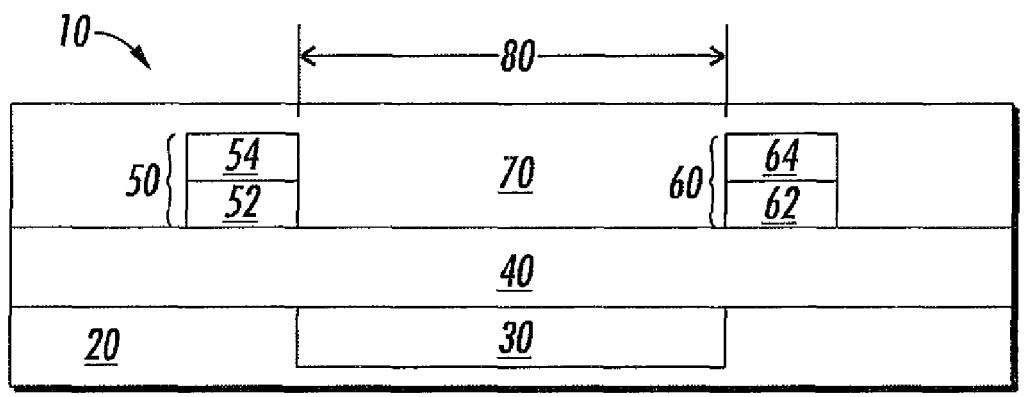
FIG. 1 represents a first embodiment of a TFT according to the present disclosure.

This disclosure describes a TFT with dual-layer source and drain electrodes. Each source and drain electrode comprises a first layer including a first conductive material and a second layer including a second conductive material. In embodiments, the source electrode first layer may be the same as or different from the drain electrode first layer. The source electrode second layer may be the same as or different from the drain electrode second layer. References to the energy level of the semiconductor refer to the HOMO or LUMO level of the semiconductor depending on whether it is p-type or n-type semiconductor, respectively.

A more complete understanding of the components, processes and apparatuses disclosed herein can be obtained by reference to the accompanying drawings. These figures are merely schematic representations based on convenience and the ease of demonstrating the present disclosure, and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

FIG. 1 illustrates a bottom-gate bottom-contact TFT configuration according to the present disclosure. The TFT 10 comprises a substrate 20 in contact with the gate electrode 30 and a gate dielectric layer 40. Although here the gate electrode 30 is depicted within the substrate 20, this is not required. However, it is important that the gate dielectric layer 40 separates the gate electrode 30 from the source electrode 50, drain electrode 60, and the semiconductor layer 70. The source electrode 50 comprises a first layer 52 and a second layer 54. The drain electrode 60 also comprises a first layer 62 and a second layer 64. The first layer 62 is closer to the gate dielectric layer 40 than the second layer 64. The semiconductor layer 70 runs over and between the source and drain electrodes 50 and 60. Both layers 52, 54, 62, 64 of the source and drain electrodes 50 and 60 contact the semiconductor layer 70. The semiconductor has a channel length 80 between the source and drain electrodes 50 and 60.

Figure 2:
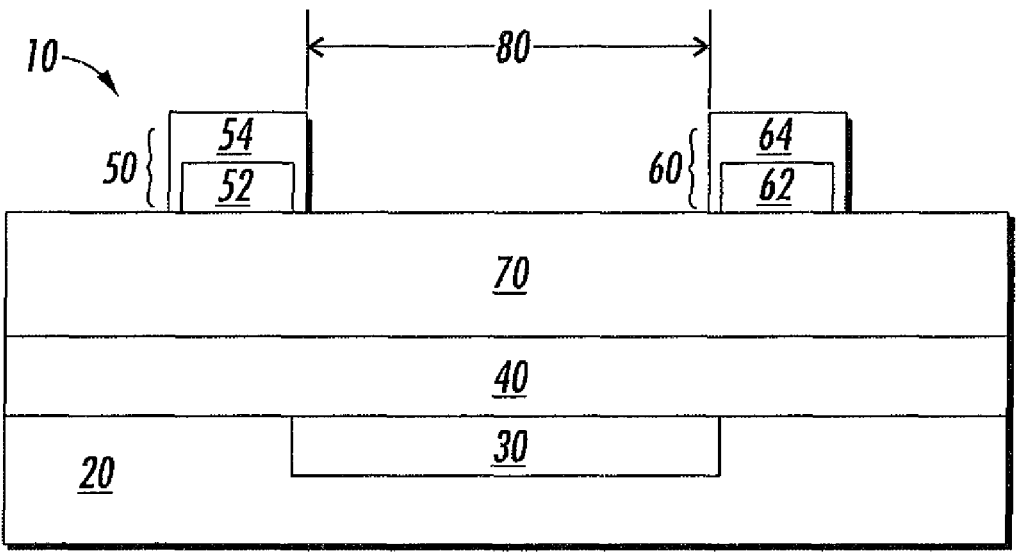
FIG. 2 represents a second embodiment of a TFT according to the present disclosure.

FIG. 2 illustrates another bottom-gate top-contact TFT configuration according to the present disclosure. The TFT 10 comprises a substrate 20 in contact with the gate electrode 30 and a gate dielectric layer 40. The semiconductor layer 70 is placed on top of the gate dielectric layer 40 and separates it from the source and drain electrodes 50 and 60. The source electrode 50 comprises a first layer 52 and a second layer 54. The drain electrode 60 also comprises a first layer 62 and a second layer 64. Both layers 52, 54, 62, 64 of the source and drain electrodes 50 and 60 contact the semiconductor layer 70.

Figure 3:
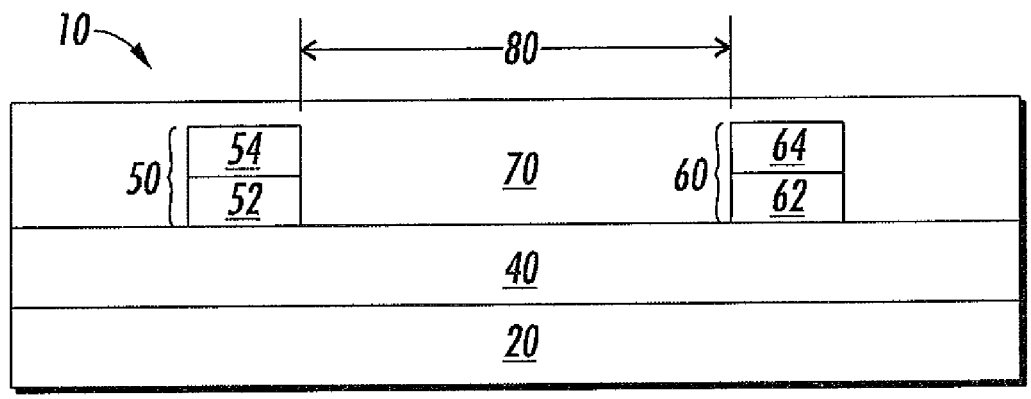
FIG. 3 represents a third embodiment of a TFT according to the present disclosure.

FIG. 3 illustrates a bottom-gate bottom-contact TFT configuration according to the present disclosure. The TFT 10 comprises a substrate 20 which also acts as the gate electrode and is in contact with a gate dielectric layer 40. The source electrode 50 comprises a first layer 52 and a second layer 54. The drain electrode 60 also comprises a first layer 62 and a second layer 64. The first layer 62 is closer to the gate dielectric layer 40 than the second layer 64. Both layers 52, 54, 62, 64 of the source and drain electrodes 50 and 60 contact the semiconductor layer 70.

Figure 4:
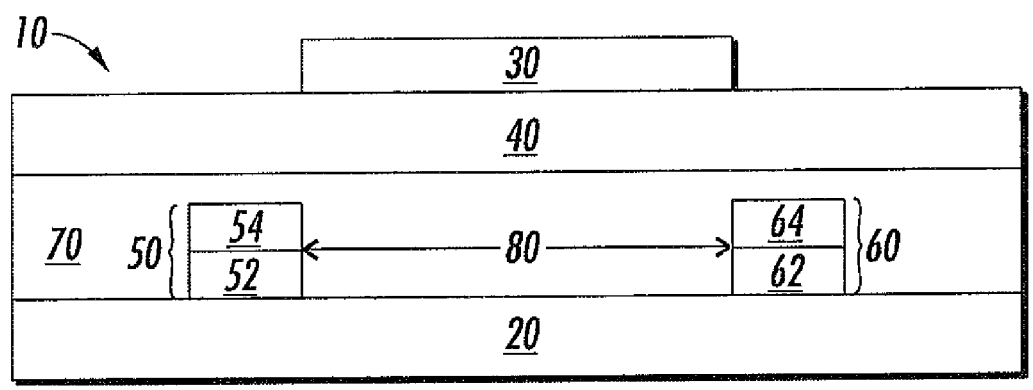
FIG. 4 represents a fourth embodiment of a TFT according to the present disclosure.

FIG. 4 illustrates a top-gate top-contact TFT configuration according to the present disclosure. The TFT 10 comprises a substrate 20 in contact with the source electrode 50, drain electrode 60, and the semiconductor layer 70. The source electrode 50 comprises a first layer 52 and a second layer 54. The drain electrode 60 also comprises a first layer 62 and a second layer 64. The semiconductor layer 70 runs over and between the source and drain electrodes 50 and 60. The gate dielectric layer 40 is on top of the semiconductor layer 70. The gate electrode 30 is on top of the gate dielectric layer 40 and does not contact the semiconductor layer 70. Both layers 52, 54, 62, 64 of the source and drain electrodes 50 and 60 contact the semiconductor layer 70.

The substrate may be composed of materials including but not limited to silicon, glass plate, plastic film or sheet. For structurally flexible devices, plastic substrate, such as for example polyester, polycarbonate, polyimide sheets and the like may be preferred. The thickness of the substrate may be from about 10 micrometers to over 10 millimeters with an exemplary thickness being from about 50 to about 100 micrometers, especially for a flexible plastic substrate and from about 1 to about 10 millimeters for a rigid substrate such as glass or silicon.

The gate electrode is composed of an electrically conductive material. It can be a thin metal film, a conducting polymer film, a conducting film made from conducting ink or paste, or the substrate itself, for example heavily doped silicon. Examples of gate electrode materials include but are not restricted to aluminum, gold, chromium, indium tin oxide, conductive polymers such as polystyrene sulfonate-doped poly(3,4-ethylenedioxythiophene) (PSS-PEDOT), and conducting ink/paste comprised of carbon black/graphite. The gate electrode can be prepared by vacuum evaporation, sputtering of metals or conductive metal oxides, conventional lithography and etching, chemical vapor deposition, spin coating, casting or printing, or other deposition processes. The thickness of the gate electrode ranges for example from about 10 to about 200 nanometers for metal films and from about 1 to about 10 micrometers for conductive polymers.

The gate dielectric layer generally can be an inorganic material film or an organic polymer film. Examples of inorganic materials suitable as the gate dielectric layer include silicon oxide, silicon nitride, aluminum oxide, barium titanate, barium zirconium titanate and the like. Examples of suitable organic polymers include polyesters, polycarbonates, poly(vinyl phenol), polyimides, polystyrene, poly (methacrylate)s, poly(acrylate)s, epoxy resin and the like. The thickness of the gate dielectric layer depends on the dielectric constant of the material used and can be, for example, from about 5 nanometers to about 5000 nanometers, including from about 100 to about 1000 nanometers. The gate dielectric layer may have a conductivity that is, for example, less than about $10^{-12}$ Siemens per centimeter (S/cm). The gate dielectric layer is formed using conventional processes known in the art, including those processes described in forming the gate electrode.

The semiconductor layer generally is an organic semiconducting material. Examples of organic semiconductors include but are not limited to acenes, such as anthracene, tetracene, pentacene, and substituted pentacenes, perylenes, fullerenes, oligothiophenes, polythiophenes and their substituted derivatives, polypyrrole, poly-p-phenylenes, poly-p-phenylvinylidenes, naphthalenedicarboxylic dianhydrides, naphthalene-bisimides, polynaphthalenes, phthalocyanines such as copper phthalocyanines or zinc phthalocyanines and their substituted derivatives. The semiconductor may also be an inorganic semiconductor such as ZnO, ZnS, silicon nanowires, and the like.

In specific embodiments, the semiconductors are polythiophenes. Polythiophenes include, for example, regioregular and regiorandom poly(3-alkylthiophene)s, polythiophenes comprising substituted and unsubstituted thienylene groups, polythiophenes comprising optionally substituted thieno[3,2-b]thiophene and/or optionally substituted thieno[2,3-b]thiophene groups, polythiophenes comprising fused-ring aromatic groups, polythiophenes comprising heteroatom-containing fused-ring aromatic groups, and polythiophenes comprising non-thiophene based aromatic groups such as phenylene, fluorene, furan, and the like.

The semiconductor layer is from about 5 nanometers to about 1000 nanometers deep, including from about 20 to about 100 nanometers in depth. In certain configurations, such as the configurations shown in FIGS. 1 and 4, the semiconductor layer completely covers the source and drain electrodes. The semiconductor layer has a channel length defined by the distance between the source and drain electrodes. In specific embodiments, the semiconductor channel length is at most 20 micrometers. In further embodiments, the semiconductor channel length is at most 10 micrometers. In specific embodiments, the semiconductor channel length is from about 5 to about 10 micrometers. In further embodiments, the semiconductor channel length is from about 1 to about 5 micrometers. The channel length is critical because a shorter channel length reduces $R_{sc}$ as discussed above. If $R_{sc}$ is large, then there is no need to introduce contact resistance to achieve a high current on/off ratio. In addition, a smaller channel length increase mobility.

The semiconductor layer can be formed by molecular beam deposition, vacuum evaporation, sublimation, spin-on coating, dip coating, printing (e.g., inkjet printing, screen printing, stencil printing, microcontact printing, flexographic printing), and other conventional processes known in the art, including those processes described in forming the gate electrode.

Regarding electrical performance characteristics, the organic semiconductor usually has a conductivity in the range of $10^{-8}$ to $10^{-4}$ S/cm. Various dopants known in the art may also be added to change the conductivity. The organic semiconductor can be either a p-type or n-type semiconductor. For p-type, the semiconductor usually has an energy level (HOMO level) of higher than 4.5 eV. In specific embodiments, the p-type semiconductor has a HOMO level of about 5.1 eV. For n-type, the semiconductor usually has a energy level (LUMO level) of lower than 4.5 eV. In specific embodiments, the n-type semiconductor has a LUMO level of about 4.0 eV. In specific embodiments, the semiconductor is a p-type semiconductor. In specific embodiments, the organic semiconductor is a polythiophene. Polythiophenes generally have a HOMO level of from about 4.7 eV to about 5.5 eV.

The first layer of either the source or drain electrode has a work function differing from the energy level of the semiconductor layer by at least 0.5 eV. In specific embodiments, the work function of the first layer differs by 0.5 to about 1.0 eV. In other embodiments, the difference is at least 1.0 eV. Of course, there is also an upper limit to the difference between the work function of the first layer and the energy level of the semiconductor. The difference should be no greater than 3.0 eV. The second layer has a work function differing from the energy level of the semiconductor layer by at most 0.2 eV. In specific embodiments, the work function of the second layer differs from the energy level of the semiconductor layer by at most 0.1 eV. Ideally, the second layer has a work function matching the energy level of the semiconductor layer. This difference is intentional because it introduces contact resistance into the TFT. It was surprisingly found that the combination of decreased $R_{sc}$ and increased $R_{contact}$ produced a TFT with both high mobility and high current on/off ratio.

In principle, almost any material can be used for either layer of the electrode as long as these requirements are met. Metals suitable for use in either layer of the source or drain electrode include, but are not limited to, platinum, gold, silver, nickel, chromium, copper, iron, tin, antimony, lead, tantalum, indium, palladium, tellurium, rhenium, iridium, aluminum, ruthenium, germanium, molybdenum, tungsten, tin oxide-antimony, indium tin oxide, fluorine-doped zinc oxide, zinc, carbon, graphite, glassy carbon, silver paste, carbon paste, lithium, beryllium, sodium, magnesium, potassium, calcium, scandium, titanium, manganese, zirconium, gallium, niobium, sodium, sodium-potassium alloy, magnesium, lithium, and their alloys. In further embodiments, the cheaper conductive materials are used; they are silver, nickel, chromium, copper, iron, tin, antimony, lead, tantalum, indium, aluminum, tungsten, tin oxide-antimony, indium tin oxide, fluorine-doped zinc oxide, zinc, carbon, graphite, silver paste, and carbon paste. That the first layer must differ by at least 0.5 eV and the second layer must differ by at most 0.2 eV from the energy level of the semiconductor layer implies that the two electrode layers always comprise different materials.

Conductive polymers may be used in either layer of the source or drain electrode. Such conductive polymers include, but are not limited to, a polyaniline, polypyrrole, PSS-PEDOT, or their derivatives or their mixtures. These polymers may also be doped to enhance their conductivity. Generally, their conductivity is greater than $10^{-3}$ S/cm.

The first layer of either electrode should be no more than about 100 nanometers thick. In further embodiments, the first layer of either electrode has a thickness from about 5 nm to about 50 nm. In specific embodiments, the first layer of either electrode has a thickness at most 50 nm. The first layer can be formed by any deposition process known in the art, including those processes described in forming the gate electrode. The second layer can be from about 5 nanometers to about 3000 nanometers thick. In specific embodiments, the second layer has a thickness at least 20 nm, including from about 20 to about 1000 nanometers thick. The second layer can be formed by any deposition process known in the art, including those processes described in forming the gate electrode.

A metal alloy may form at the interface between the first layer and the second layer of each electrode. Depending on the device structure and fabrication procedure, (for example, when the second metal layer is deposited after the first metal layer, there may be diffusion of the second layer metal into the first layer to form a metal alloy. This diffusion may take place in a range of about 0.1 nm to about 5 nm thickness.

The first layers of both the source and drain electrodes are preferably composed of the same material, as are the second layers. For example, in a specific embodiment, the first layer of both the source and drain electrodes is titanium and the second layer of both electrodes is gold. Most p-type organic semiconductors have a work function of about 5.1 eV. Titanium has a work function of 4.1 eV, differing from the semiconductor by at least 0.5 eV. Gold has a work function of 5.1 eV as well, matching the semiconductor. However, the present disclosure also contemplates that the materials of both layers of either electrode are independently selected.

As seen in FIGS. 1-4, both layers of the source and drain electrode directly contact the semiconductor layer. In embodiments, the source electrode first layer is closer to the gate dielectric layer than the source electrode second layer. In further embodiments, the TFT is a bottom-gate bottom-contact TFT and the source electrode first layer directly contacts the gate dielectric layer.

In specific embodiments, the TFT has dual-layer electrodes wherein the first layer of the source and drain electrodes have a work function differing from the energy level of the semiconductor layer by at least 0.5 eV. The second layers have a work function differing from the energy level of the semiconductor layer by at most 0.1 eV. In addition, the semiconductor channel length is at most 20 micrometers.

In embodiments with both small semiconductor channel length and a dual-layer source and drain electrode design, both high mobility and high current on/off ratio are achieved.

The various components of the OTFT may be deposited upon the substrate in any order. Generally, however, the gate electrode and the semiconductor layer should both be in contact with the gate dielectric layer. In addition, the source and drain electrodes should both be in contact with the semiconductor layer. In particular both layers of the electrodes should be in contact with the semiconductor layer.

The following examples are for purposes of further illustrating OTFTs with multilayer electrodes in accordance with the present disclosure. The examples are merely illustrative and are not intended to limit devices made in accordance with the disclosure to the materials, conditions, or process parameters set forth therein. All parts are percentages by volume unless otherwise indicated.

EXAMPLES

Example 1

A bottom-contact thin-film transistor with a configuration illustrated in FIG. 3 was built. It comprised an n-doped silicon wafer with a thermally grown silicon oxide layer having a thickness of about 300 nanometers. The wafer functioned as the gate electrode. The silicon oxide layer functioned as the gate dielectric layer. A 10-nanometer layer of titanium was applied in two locations corresponding to the source and drain electrodes. This titanium layer was the first layer of the dual-layer electrodes. Next, a 100-nanometer layer of gold was applied to the titanium layers to form the second layer of the dual-layer electrodes. The semiconductor channel length (i.e. distance between the source and drain electrodes) was 5 microns.

The silicon oxide surface was modified with octyltrichlorosilane (OTS-8) by immersing the devices in 0.1 M OTS-8 solution in toluene at 60° C. for 20 min. The gold surface was then modified with octanethiol by immersing the devices in 0.01 M octanethiol solution in toluene at room temperature for 20 min. The following polythiophene was then deposited to form the semiconductor layer:

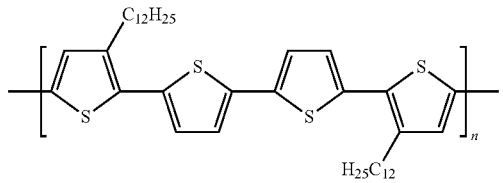

where n is a number of from about 5 to about 5,000. In this example, the polymer possessed an $M_w$ of 22,900 and $M_n$ of 17,300 relative to polystyrene standards. This polythiophene and its preparation are described in U.S. Pat. No. 6,770,904, the disclosure of which is totally incorporated herein by reference. The polythiophene was spin coated, then annealed at 140° C. (its phase transition temperature). The transistor had a semiconductor channel length of 5 microns and a channel width of 250 microns. The semiconductor had a HOMO level of 5.1 eV, which differed from the work function of the source electrode first titanium layer (4.1 eV) by 1.0 eV and matched the work function of the source electrode second gold layer (5.1 eV).

The device was characterized using a Keithley 4200 SCS semiconductor characterization system. The charge carrier mobility, μ, was calculated from the data in the saturated regime (gate voltage, $V_G$<source-drain voltage, $V_{SD}$) according to equation (1)

$$I_{SD} = C_i \mu (W/2L)(V_G - V_T)^2 \qquad (1)$$

where $I_{SD}$ is the drain current at the saturated regime, W and L are, respectively, the semiconductor channel width and length, $C_i$ is the capacitance per unit area of the gate dielectric layer, and $V_G$ and $V_T$ are, respectively, the gate voltage and threshold voltage. $V_T$ of the device was determined from the relationship between the square root of $I_{SD}$ at the saturated regime and $V_G$ of the device by extrapolating the measured data to $I_{SD}=0$.

Another important property of a thin-film transistor is its current on/off ratio. This is the ratio of the saturation source-drain current when the gate voltage $V_G$ is equal to or greater than the drain voltage $V_D$ to the source-drain current when the gate voltage $V_G$ is zero. The mobility was calculated to be 0.39 $cm^2/V$ sec and the current on/off ratio was about $10^7$.

Comparative Example 1

In Comparative Example 1, a transistor was fabricated as in Example 1 except the source and drain electrodes were a single layer of gold and had a channel length of 90 microns. The mobility was calculated to be 0.12 $cm^2/V$ sec and the current on/off ratio was about $10^7$.

Comparative Example 2

In Comparative Example 2, transistors were fabricated as in Example 1 except the source and drain electrodes were a single layer of gold and the channel length was 2 or 5 microns. They had mobility of up to 0.45 $cm^2/V$ sec, but a current on/off ratio of less than $10^4$.

Comparing Comparative Example 1 with Comparative Example 2 revealed that a short semiconductor channel length increased mobility significantly. Comparing Example 1 with Comparative Example 1 showed that without contact resistance, a short semiconductor channel length also dramatically decreased the current on/off ratio (from $10^7$ to $10^4$). By intentionally introducing contact resistance with the dual-layer electrode design, both high mobility and high current on/off ratio were achieved.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

The invention claimed is:

1. A thin-film transistor, comprising:
   a source electrode; a drain electrode; a gate dielectric layer; and
   a polythiophene semiconductor layer;
   wherein the source electrode and drain electrode each comprise a first layer and a second layer, the first layer directly contacting the dielectric layer and separating the second layer from the dielectric layer, the second layer directly contacting the semiconductor layer;
   wherein the source electrode first layer has a work function differing from the energy level of the semiconductor layer by at least 1.0 eV;
   wherein the source electrode second layer has a work function differing from the energy level of the semiconductor layer by at most 0.2 eV;
   wherein the semiconductor layer has a channel length of from about 1 to about 5 micrometers; and
   wherein the transistor has a mobility of at least 0.39 cm$^2$/v·sec and a current on/off ratio of at least about $10^7$.

2. The thin-film transistor of claim 1, wherein the source electrode first layer, the drain electrode first layer, the source electrode second layer, and the drain electrode second layer independently comprise a material selected from the group consisting of titanium, platinum, gold, silver, nickel, chromium, copper, iron, tin, antimony, lead, tantalum, indium, palladium, tellurium, rhenium, iridium, aluminum, ruthenium, germanium, molybdenum, tungsten, tin oxide-antimony, indium tin oxide, fluorine-doped zinc oxide, zinc, carbon, graphite, silver paste, carbon paste, lithium, beryllium, sodium, magnesium, potassium, calcium, scandium, manganese, zirconium, gallium, niobium, sodium, sodium-potassium alloy, magnesium, lithium, and alloys thereof.

3. The thin-film transistor of claim 1, wherein the source electrode first layer and the drain electrode first layer each have a thickness of at most 50 nanometers.

4. The thin-film transistor of claim 1, wherein the source electrode first layer and the drain electrode first layer each have a thickness of from about 5 nanometers to about 50 nanometers.

5. The thin-film transistor of claim 1, wherein the source electrode second layer and the drain electrode second layer each have a thickness of at least 5 nanometers.

6. The thin-film transistor of claim 1, wherein the source electrode second layer and the drain electrode second layer each have a thickness of from about 20 to about 1000 nanometers.

7. The thin-film transistor of claim 1, wherein the semiconductor is a p-type semiconductor.

8. The thin-film transistor of claim 1, wherein the source electrode first layer, the drain electrode first layer, the source electrode second layer, and the drain electrode second layer each directly contact the semiconductor layer.

9. The thin-film transistor of claim 1, wherein the source electrode second layer has a work function matching the energy level of the semiconductor layer.

10. An organic thin-film transistor, comprising:
    a source electrode; a drain electrode; a gate dielectric layer; and
    organic polythiophene semiconductor layer;
    wherein the source electrode and drain electrode each comprise a first layer and a second layer, the first layer directly contacting the dielectric layer and separating the second layer from the dielectric layer;
    wherein each first layer has a work function differing from the energy level of the semiconductor layer by at least 0.5 eV;
    wherein each second layer has a work function differing from the energy level of the semiconductor layer by at most 0.2 eV; and
    wherein the semiconductor layer has a channel length of from about 5 to about 10 micrometers; and
    wherein the transistor has a mobility of at least 0.39 cm$^2$/V·sec and a current on/off ratio of at least about $10^7$.

11. The thin-film transistor of claim 10, wherein the difference in work function between the semiconductor layer and each first layer is from 0.5 eV to about 1.0 eV.

12. The thin-film transistor of claim 10, wherein the difference in work function between the organic semiconductor layer and each first layer is at least 1.0 eV.

13. The thin-film transistor of claim 10, wherein the source electrode first layer and the drain electrode first layer each comprise titanium.

14. The thin-film transistor of claim 10, wherein the source electrode second layer and the drain electrode second layer each comprise gold.

15. The thin-film transistor of claim 10, wherein the transistor is a bottom-gate bottom-contact transistor.

16. A bottom-gate bottom-contact organic thin-film transistor, comprising:
    a dielectric layer;
    a source electrode; a drain electrode; and
    a polythiophene semiconductor layer;
    wherein the source electrode and drain electrode each comprise a first layer of titanium and a second layer of gold, the first layer directly contacting the dielectric layer and separating the second layer from the dielectric layer, the second layer directly contacting the semiconductor layer; and
    wherein the semiconductor layer has a channel length of at most about 10 micrometers;
    wherein the transistor has a mobility of at least 0.39 cm$^2$/V·sec and a current on/off ratio of at least about $10^7$.

* * * * *